United States Patent
Cox et al.

(10) Patent No.: US 6,264,094 B1
(45) Date of Patent: Jul. 24, 2001

(54) REWORK AND UNDERFILL NOZZLE FOR ELECTRONIC COMPONENTS

(75) Inventors: Wilton L. Cox, Charlotte; Joseph D. Poole, Troutman; Kris A. Slesinger, Charlotte, all of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/511,036

(22) Filed: Feb. 23, 2000

Related U.S. Application Data

(62) Division of application No. 09/244,565, filed on Feb. 2, 1999.

(51) Int. Cl.[7] .............. B23K 31/00; B23K 31/02; B23K 1/19; B23K 20/16
(52) U.S. Cl. .................. 228/180.21; 228/180.1; 228/261
(58) Field of Search .................. 228/101, 178, 228/180.1, 180.21, 199, 225, 244, 256, 258, 260, 261

(56) References Cited

U.S. PATENT DOCUMENTS

| | | | |
|---|---|---|---|
| 4,295,596 | * 10/1981 | Doten et al. | 228/180 A |
| 4,752,025 | * 6/1988 | Stach et al. | 228/9 |
| 4,937,006 | * 6/1990 | Bickford et al. | 228/219 |
| 4,972,990 | * 11/1990 | Abbagnaro et al. | 228/20 |
| 5,203,076 | 4/1993 | Banerji et al. . | |
| 5,355,580 | 10/1994 | Tsukada . | |
| 5,419,481 | 5/1995 | Lasto et al. . | |
| 5,471,310 | * 11/1995 | Spigarelli et al. | 356/399 |
| 5,516,030 | * 5/1996 | Denton | 228/180.22 |
| 5,560,531 | 10/1996 | Ruszowski . | |
| 5,613,633 | * 3/1997 | French et al. | 228/264 |
| 5,669,437 | * 9/1997 | Hernandez et al. | 165/47 |
| 5,766,987 | 6/1998 | Mitchell et al. . | |
| 5,866,442 | * 2/1999 | Brand | 438/108 |
| 5,879,786 | * 3/1999 | Budnaitis et al. | 428/209 |
| 5,888,884 | * 3/1999 | Wojnarowski | 438/462 |
| 5,906,682 | * 5/1999 | Bouras et al. | 118/712 |

FOREIGN PATENT DOCUMENTS 2 186 222   8/1987  (GB) .

OTHER PUBLICATIONS

IBM Technical Disclosure Bulletin, vol. 30, No. 1, Jun. 1987, Robotic Hot Air Solder/Desolder Placement Device, pp. 114–116.

* cited by examiner

Primary Examiner—Tom Dunn
Assistant Examiner—Zidia T. Pittman
(74) Attorney, Agent, or Firm—Schmeiser, Olsen & Watts; Lawrence R. Fraley

(57) ABSTRACT

A method and apparatus for desoldering electronic components from a substrate. A vacuum is used to enhance the flow of a hot gas under an electronic component to reflow the solder connections attaching the electronic component to a substrate. Water vapor is added to the hot gas to increase the heat capacity of the hot gas. A system for periodically changing the direction of flow of the hot gas and vacuum under the electronic component is used to uniformly heat the solder connections.

A method and apparatus for depositing underfill material between an electronic component and the substrate on which the electronic component is mounted. A vacuum is applied to enhance the flow of underfill material into the space between the electronic component and the substrate.

10 Claims, 5 Drawing Sheets

REWORK AND UNDERFILL NOZZLE FOR ELECTRONIC COMPONENTS

This application is a divisional of Ser. No. 09/244,565, filed on Feb. 2, 1999 now allowed.

FIELD OF THE INVENTION

The present invention is in the field of integrated circuits. More particularly, the present invention provides a method and apparatus for desoldering electronic components from a substrate. Another embodiment of the present invention provides a method and apparatus for depositing underfill material between an electronic component and the substrate on which the electronic component is mounted.

BACKGROUND OF THE INVENTION

Electronic components, such as integrated circuit chips, are commonly attached to a substrate (e.g., a printed circuit board (PCB) or printed circuit card (PCC)) with solder connections using a ball grid array (BGA), chip scale package (CSP), or direct chip attach (DCA) technique. Occasionally, an electronic component may be found to be defective, and will therefore have to be removed and replaced with a functional electronic component using a rework process. In a conventional rework process, the defective electronic component is removed by first heating the solder material, used to connect the component's solder connectors to corresponding contact pads on the, substrate, to its melting, or "reflow" temperature. Then, the defective electronic component is pulled off the substrate and replaced.

In a conventional rework process, a stream of hot gas is typically directed toward the top of the electronic component. This method works well if the solder connections are only located around or near the periphery of the electronic component, or when there is a relatively large gap between the bottom of the electronic component and the substrate. Unfortunately, using currently available reflow methods, heat from the stream of hot gas is not effectively or evenly transmitted to solder connections located away from the periphery of the electronic component (e.g., near the center of the electronic component). This is especially problematic if the space between the electronic component and the substrate is small, thereby restricting the flow of hot gas from the periphery to the center of the electronic component.

Electronic components mounted on a substrate commonly require underfill to increase reliability, mechanical integrity, and to ensure adequate operational life. For example, an underfill material such as epoxy is commonly inserted between an electronic component and a substrate to cover the solder connections, thereby protecting the solder connections from corrosion causing fluids or gases, and mechanically strengthening the connection between the electronic component and the substrate. Further, the use of underfill reduces failure of the solder connections due to cycling stresses caused by differences in the coefficients of thermal expansion of the electronic component and the substrate. Thus, underfill provides a robust mechanical connection preventing damaging relative motion between the electronic component and the substrate.

Commonly, the underfilling is accomplished by depositing a bead of underfill material along one or more sides of the electronic component and allowing capillary action to pull the underfill material under the electronic component. Unfortunately, not only is the process relatively slow and may leave voids in the underfill, but also requires the underfill material to be very fluid in nature. Thus, restrictions are placed on the composition of the underfill material.

SUMMARY OF THE INVENTION

The present invention avoids the disadvantages of the prior art by providing an improved method and apparatus for removing an electronic component from a substrate. Also, the current invention provides an improved method and apparatus for applying underfill between the electronic component and the substrate.

In accordance with the present invention, a rework nozzle apparatus is used to remove an electronic component from a substrate. The rework nozzle apparatus includes an outer tube, an inner shaft, baffles, a vacuum source, a hot gas source, and a water vapor port. The outer tube has a cross-sectional shape slightly larger than that of the electronic component. A first end of the outer tube contacts the substrate surface, encloses the electronic component, and provides an essentially gas tight seal. The inner shaft has a cross-sectional shape similar to the top surface of the electronic component. A first end of the inner shaft contacts, and essentially provides a gas tight seal against, the top surface of the electronic component. The first end of the inner shaft may include projections for locating the electronic component in the horizontal direction. Baffles are attached between the inner shaft and the outer tube to direct a flow of hot gas beneath the electronic component, and to provide a seal against the substrate adjacent two sides of the electronic component. The outer tube, inner shaft, and the baffles form two ducts. The first duct is used to carry and direct a stream of hot gas to a region under a first side of the electronic component. The second duct is used to apply a vacuum to a region under a second side of the electronic component to increase the flow of hot gas under the electronic component. The vacuum is provided to the second duct by a vacuum source such as a vacuum pump. Solder connections under the electronic component are heated to a reflow temperature allowing the electronic component to be removed from the substrate. In order to increase the heat capacity of the hot gas, thereby enhancing thermal transfer to the solder connections, water vapor, or other suitable substance, is added to the hot gas through a water vapor port.

The rework nozzle apparatus may additionally include a vertical positioning apparatus, a heating element, and a reversing valve. The vertical positioning apparatus provides vertical positioning relative to the inner shaft, by means of a drive system such as a linear motor or stepper motor. The vertical positioning apparatus is slidably attached to the inner shaft. Heat is applied by the heating element to the inner shaft, preventing the inner shaft from drawing heat away from the electronic component during the rework process. The reversing valve periodically switches the vacuum from the second duct to the first duct, and simultaneously switches the hot gas from the first duct to the second duct, effectively reversing the direction of flow of the stream of hot gas. At the same time, the water vapor is switched from a water vapor port on the first duct to a water vapor port on the second duct. Advantageously, the use of the reversing valve provides a more uniform heating of the solder connections.

In accordance with the present invention, an underfill nozzle apparatus is used to insert underfill material under the electronic component. Preferably, underfill material is deposited along three sides of the electronic component, and a vacuum is applied under the fourth side of the electronic component to draw the underfill material under the electronic component.

The underfill nozzle apparatus includes a vacuum tube and a vacuum source. A first end of the vacuum tube contacts the substrate surface and provides an essentially gas tight seal. A side of the vacuum tube contacting the electronic component has an opening sized according to the cross-sectional open area under the electronic component. A vacuum is drawn through this opening promoting the flow of the underfill material under the electronic component.

Another embodiment of the underfill nozzle apparatus includes a vacuum tube, a vacuum source, an underfill tube, an underfill material source, baffles, a heat generating apparatus, and a control system. A first side of the vacuum tube contacts a first side of the electronic component. A first side of the underfill tube contacts a second, opposing side of the electronic component. The first side of the vacuum tube and the first side of the underfill tube each include an opening sized according to the cross-sectional open area under the electronic component.

The vacuum tube includes a first end that contacts the substrate surface, and a second end that is connected to a vacuum source. The underfill tube includes a first end that contacts the substrate surface, and a second end that is connected to a source of underfill material. A series of baffles are used to couple the vacuum tube to the underfill tube, and to seal the openings under the remaining open sides of the electronic component The heat generating apparatus provides means for heating the electronic component and the underfill material in the underfill tube to reduce the effective viscosity of the underfill material. The reduced viscosity of the underfill material results in a faster flow rate of underfill material beneath the electronic component.

Another embodiment of an underfill nozzle apparatus in accordance with the present invention includes a vacuum tube. A through hole is provided in the substrate at a location under the electronic component. Underfill material is deposited along the periphery of the electronic component and a first end of the vacuum tube is placed over the substrate through hole. The first end of the vacuum tube contacts the substrate surface on the side opposite from the electronic component, forming an essentially gas tight seal. A vacuum source is connected to a second end of the vacuum tube to generate a vacuum in the vacuum tube, the substrate hole, and the space underneath the electronic component. This vacuum rapidly pulls the underfill material under the electronic component.

In another embodiment of the underfill nozzle apparatus, a vacuum tube surrounds the electronic component on a first side of the substrate. A through hole is provided in the substrate at a location under the electronic component. A first end of an underfill tube contacts the substrate surface on the side opposite the electronic component, and encloses the through hole. A second end of the underfill tube is connected to an underfill supply source that provides underfill material to the area under the electronic component via the underfill tube and through hole. The vacuum surrounding the electronic component causes the underfill to rapidly fill the space under the electronic component.

BRIEF DESCRIPTION OF THE DRAWINGS

The features of the present invention will best be understood from a detailed description of the invention and a preferred embodiment thereof selected for the purposes of illustration and shown in the accompanying drawings in which.

DETAILED DESCRIPTION OF THE INVENTION

Figure 1:
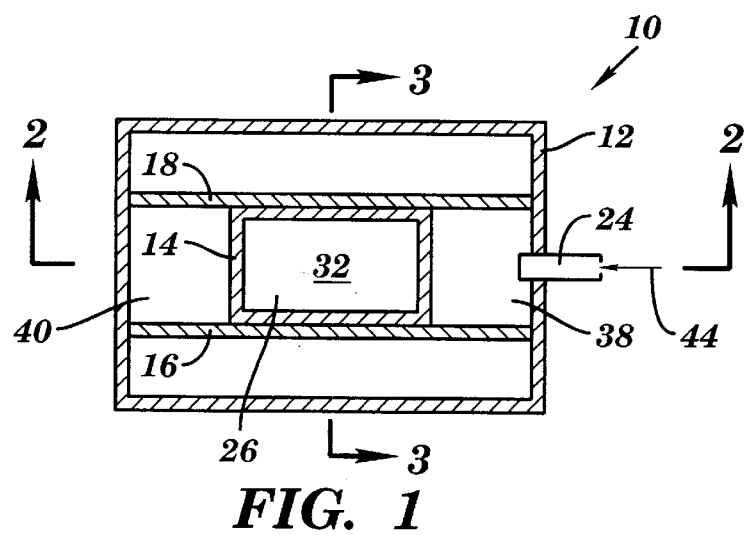
FIG. 1 illustrates a plan cross-sectional view of a rework nozzle apparatus in accordance with a first embodiment of the present invention.

The features and advantages of the present invention are illustrated in detail in the accompanying drawings, wherein like reference numerals refer to like elements throughout the drawings.

Figure 2:
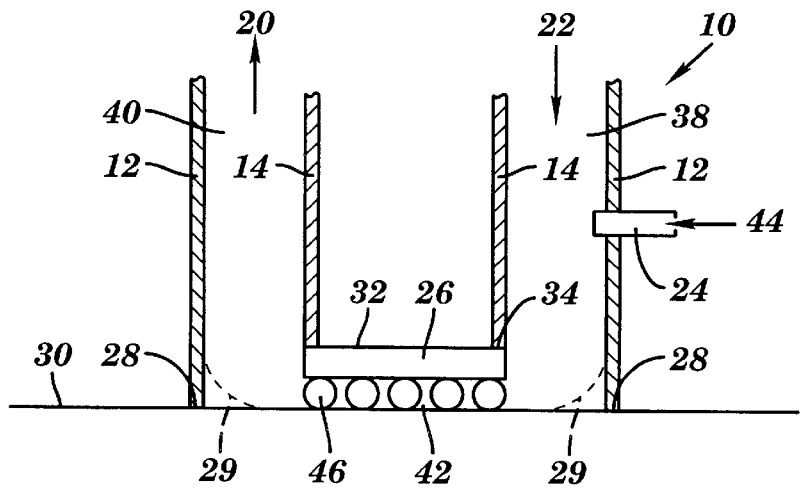
FIG. 2 illustrates a cross-sectional view taken along line 2—2 of the rework nozzle apparatus of FIG. 1.
Figure 3:
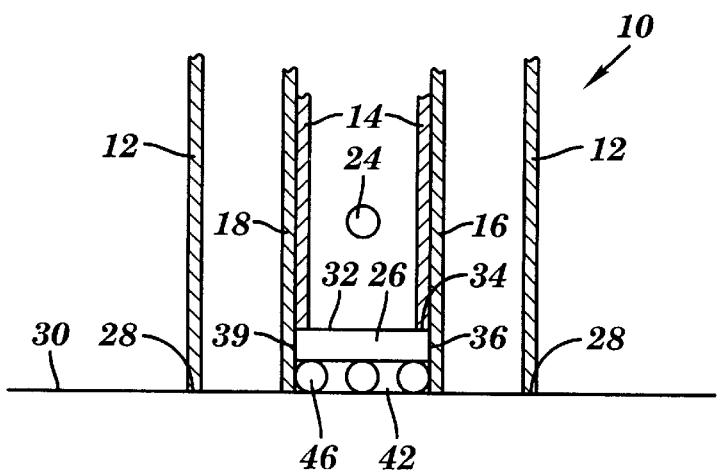
FIG. 3 illustrates a cross-sectional view taken along line 3—3 of the rework nozzle apparatus of FIG. 1.

A rework nozzle apparatus 10 in accordance with a first embodiment of the present invention is illustrated in FIGS. 1, 2 and 3. The rework nozzle apparatus 10 is used to remove an electronic component 26 from a substrate 30 by heating the solder connections 46 that attach the electronic component 26 to the substrate 30 to a suitable reflow temperature. The rework nozzle apparatus 10 includes an outer tube 12, an inner shaft 14, baffles 16, 18, a vacuum source 20, a hot gas source 22, and a water vapor port 24. The outer tube 12 has a cross-sectional shape slightly larger than that of the electronic component 26. A first end 28 of the outer tube 12 contacts the surface of the substrate 30, and provides an essentially gas tight seal around the electronic component 26. The first end 28 of the outer tube 12 can also include curving bottom walls 29 as shown by the phantom lines in FIG. 2. The curving bottom walls 29 assist the flow of gas or liquid under the electronic component 26. Although described in conjunction with the embodiment illustrated in FIG. 2, it should be clear that the curving bottom walls 29 can also be used in the additional embodiments of the present invention described below. The inner shaft 14 has a cross-sectional shape similar to the top surface 32 of the electronic component 26. A first end 34 of the inner shaft 14 contacts and provides a gas tight seal against the top surface 32 of the electronic component 26.

The inner shaft 14 is attached to the outer tube 12 by the baffles 16, 18. The baffles 16, 18 also provide a seal against the surface of the substrate 30 on opposing sides 36, 39 of the electronic component 26. The outer tube 12, the inner shaft 14, and the baffles 16, 18, form two ducts 38, 40 as shown in FIGS. 1 and 2. Duct 38 is used to carry and direct a supply of hot gas from the hot gas source 22 to the space 42 under the electronic component 26. Also, to increase the heat capacity of the hot gas, water vapor 44 is added through a water vapor port 24. Duct 40 is used to apply a vacuum generated by the vacuum source 20 to the space 42 under the electronic component. The use of the vacuum increases the flow of hot gas 22 passing over the solder connections 46, thereby decreasing the time required to heat the solder connections 46 to a required reflow temperature. After the solder connections 46 are heated to the reflow temperature, the electronic component 26 can be removed from the substrate 30.

Figure 4:
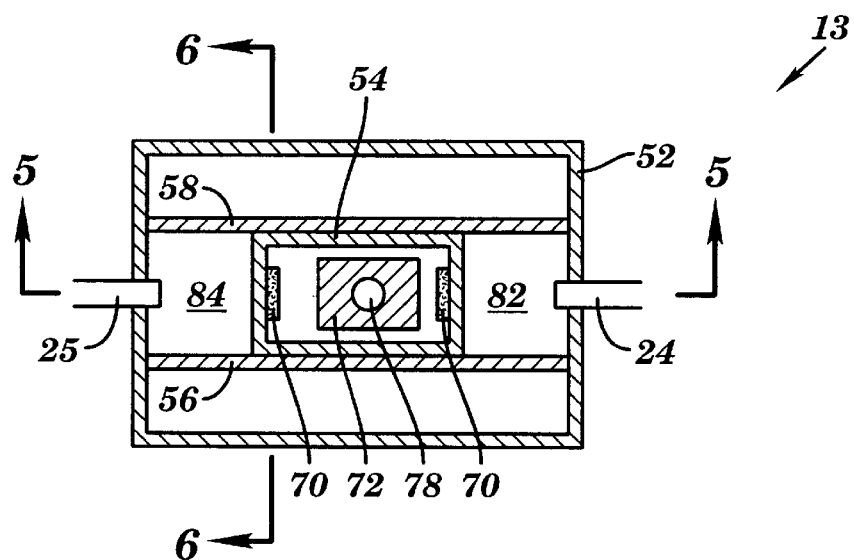
FIG. 4 illustrates a plan cross-sectional view of a rework nozzle apparatus in accordance with a second embodiment of the present invention.
Figure 5:
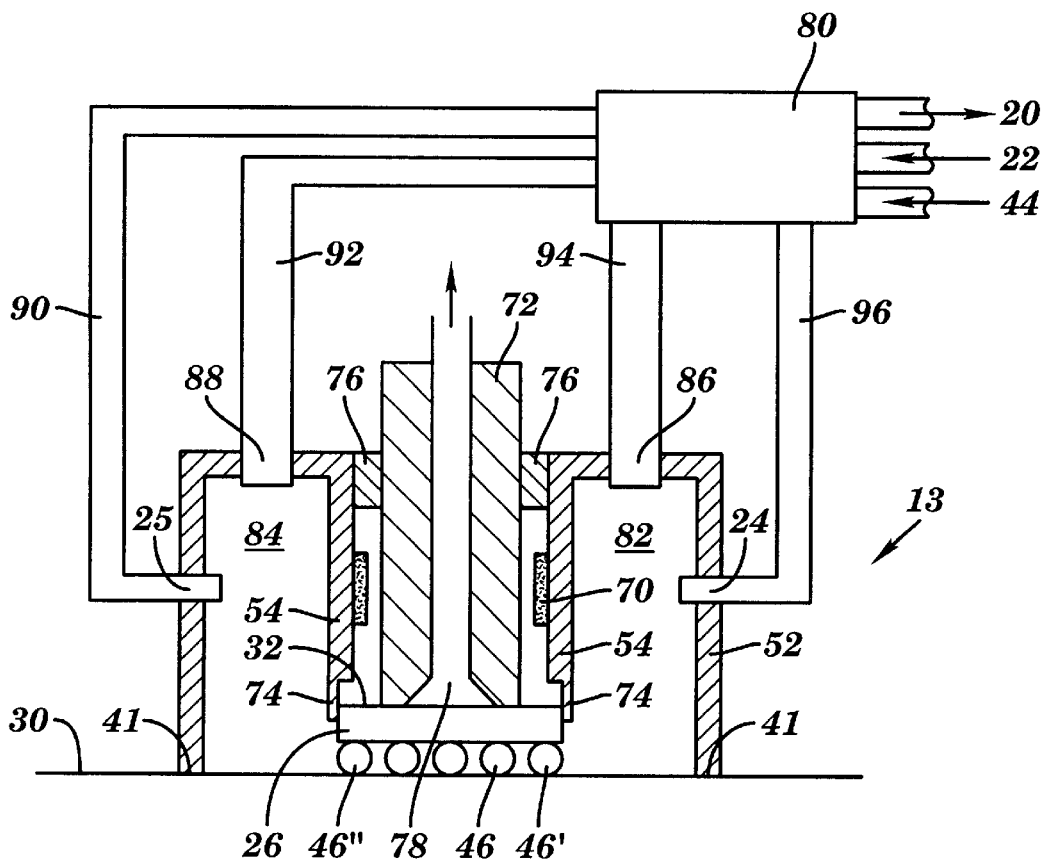
FIG. 5 illustrates a cross-sectional view taken along line 5—5 of the rework nozzle apparatus of FIG. 4.
Figure 6:
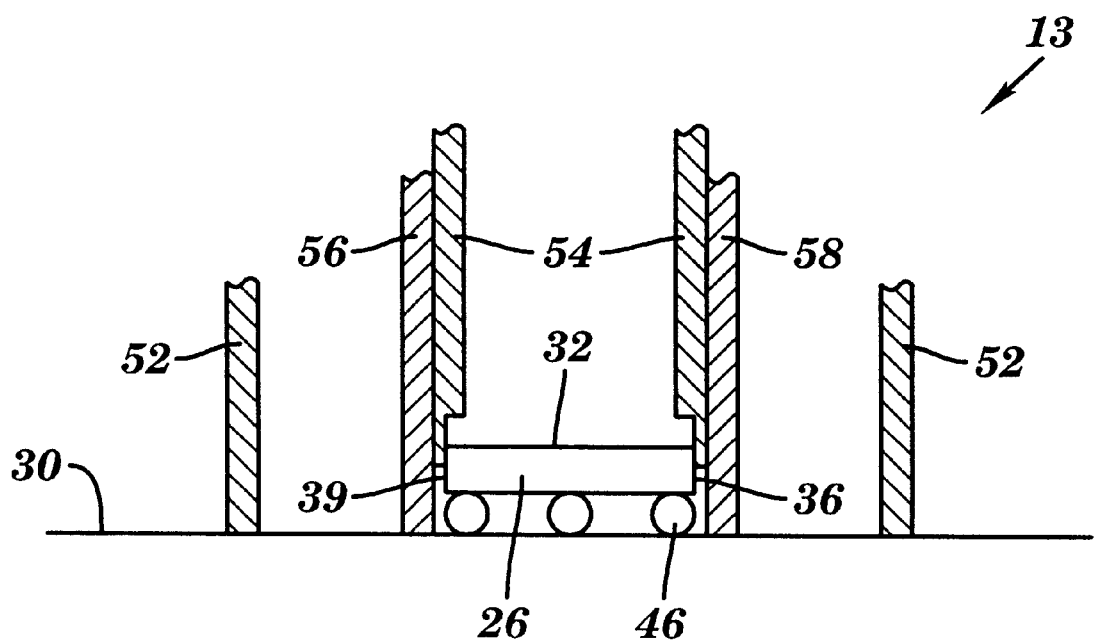
FIG. 6 illustrates a cross-sectional view taken along line 6—6 of the rework nozzle apparatus of FIG. 4.

A second embodiment of a rework nozzle apparatus 13 in accordance with the present invention is illustrated in FIGS. 4, 5 and 6. The rework nozzle apparatus 13 includes an outer tube 52, an inner shaft 54, a vertical positioning apparatus 72, a heating element 70, baffles 56, 58, a vacuum source 20, a hot gas source 22, a water vapor source 44, water vapor ports 24, 25, and a reversing valve 80.

The outer tube 52 has a cross-sectional shape slightly larger than that of the electronic component 26. A first end 41 of the outer tube 52 contacts the surface of the substrate 30, and provides an essentially gas tight seal around the electronic component 26. The inner shaft 54 has a cross-sectional shape similar to the top surface 32 of the electronic component 26, and has projections 74 for locating the electronic component 26 in the horizontal direction.

As illustrated in FIGS. 4 and 6, the baffles 56, 58 are attached to the inner shaft 54 and the outer tube 52. As further illustrated in FIG. 6, the baffles 56, 58 extend to the surface of the substrate 30, thereby providing a seal against the surface of the substrate 30 on opposing sides 36, 39 of the electronic component 26. The outer tube 52, the inner shaft 54, and the baffles 56, 58 form two ducts 82 and 84 as illustrated in FIGS. 4 and 5.

The vertical positioning apparatus 72 is slidably attached 76 to the inner shaft 54. A vacuum is applied to a vacuum port 78 to hold the top surface 32 of the electronic component 26 against the vertical positioning apparatus 72. The vertical positioning apparatus 72 provides vertical positioning of the electronic component 26 relative to the substrate 30. The vertical positioning apparatus 72 preferably includes a linear motor or stepper motor (not shown) or other suitable drive system.

The heating element 70 preheats the inner shaft 54 to prevent heat from being drawn away from the electronic component 32 during the rework process. The inner shaft 54 may be preheated using a resistive heating element, a source of hot gas, or other suitable heating system.

As in the first embodiment of the rework nozzle apparatus 10, a stream of hot gas, a vacuum, and a supply of water vapor are used to facilitate and accelerate the rework process. In the second embodiment of the rework nozzle 13, however, a reversing valve 80 is additionally used to provide a more uniform heating of the solder connections 46 of the electronic component 26.

As illustrated in FIG. 5, the hot gas supply 22 and the water vapor supply 44 are provided to the reversing valve 80. In addition, the vacuum source 20 is coupled to the reversing valve 80. A first set of conduits 92, 94 are provided to selectively direct a stream of hot gas or a vacuum from the reversing valve 80 to the ducts 82, 84 through ports 86, 88, respectively. A second set of conduits 90, 96 are provided to selectively direct water vapor from the reversing valve 80 to the water vapor ports 24, 25 located in ducts 82, 84, respectively.

A first operating position of the reversing valve 80 causes the vacuum source 20 to generate a vacuum in duct 84 via conduit 92 and port 88, and simultaneously causes a stream of hot gas provided by the hot gas source 22 to be supplied through conduit 94 and port 86 to the duct 82. Thus, hot air passes in a first direction through duct 82, under the electronic component 26, and into duct 84. The hot air is subsequently drawn out of duct 84 through port 88 and conduit 92. In addition, the first operating position of the reversing valve 80 causes water vapor from the water vapor source 44 to be supplied through conduit 96 and water vapor port 24 to the duct 82.

With the reversing valve 80 in the first operating position, hot gas and water vapor rapidly flow from duct 82, under electronic component 26, to duct 84, thereby rapidly heating the solder connections 46 that attach the electronic component 26 to the substrate 30. This flow direction causes a solder connection 46' on the end of the electrical component 26 adjacent the duct 82 to heat faster than a solder connection 46" located on the opposite side of the electrical component 26 (i.e., near duct 84). This uneven heating occurs because the hot gas releases energy as it travels from duct 82, under the electrical component 26, into duct 84. The release of energy is accompanied by a corresponding decrease in the temperature of the gas.

In order to provide a rapid uniform heating of all of the solder connections 46, thereby avoiding the uneven heating described above, the reversing valve 80 is switched to a second operating position. In the second operating position, the reversing valve 80 causes the vacuum source 20 to generate a vacuum in duct 82 via conduit 94 and port 86, and simultaneously causes a stream of hot gas provided by the hot gas source 22 to be supplied through conduit 92 and port 88 to the duct 84. Thus, hot air passes in a second, opposite direction through duct 84, under the electronic component 26, and into duct 82. The hot air is subsequently drawn out of duct 82 through port 86 and conduit 94. In addition, the second operating position of the reversing valve 80 causes water vapor from the water vapor source 44 to be supplied through conduit 90 and water vapor port 25 to the duct 84. Thus, when the reversing valve 80 is in the second position, hot gas and water vapor rapidly flow from duct 84 to the vacuum in duct 82.

By periodically switching the reversing valve from the first to the second operating position, rapid, essentially uniform heating of the solder connections 46 occurs. That is, hot air flows past each of the solder connections 46 in two different directions, thereby providing a substantially uniform heating of the solder connections 46. This minimizes the time that is required to heat all the solder connections 46 to a required reflow temperature.

The operation of the reversing valve and the configuration of associated conduits and ports may be expanded to periodically direct a flow of hot air under the electronic component 26 from more than two different directions. This would provide an even more uniform heating of the solder connections 46. In addition, a heating medium other than a hot gas may be used. For example, a liquid heated to a sufficient temperature could be directed under the electronic component 26 in a single direction, or in multiple directions, to reflow the solder connections 46.

Figure 7:
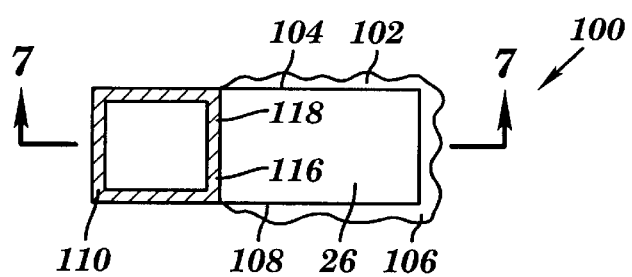
FIG. 7 illustrates a plan cross-sectional view of a first embodiment of an underfill nozzle apparatus in accordance with the present invention.
Figure 8:
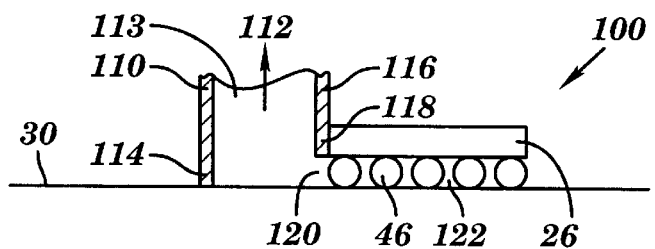
FIG. 8 illustrates a cross-sectional view taken along line 7—7 of the underfill nozzle apparatus of FIG. 7.

FIGS. 7 and 8 illustrate a first embodiment of an underfill nozzle apparatus 100 in accordance with the present invention. Underfill material 102 is deposited along three sides 104, 106, and 108, of the electronic component 26. Solder connections 46 attach, and create a space 122 between, the electronic component 26 and the surface of the substrate 30. The underfill nozzle apparatus 100 includes a vacuum tube 110 and a vacuum source 112. A first end 114 of the vacuum tube 110 contacts the surface of the substrate 30, and provides an essentially gas tight seal. A second end 113 of the vacuum tube 110 is connected to the vacuum source 112. A side 116 of the vacuum tube 110 is positioned in contact with a side 118 of the electronic component 26. A vacuum is drawn through the opening 120 between the electrical component 26 and the substrate 30 on side 118 of the electronic component 26. The vacuum rapidly draws the underfill material 102 previously deposited along the three remaining sides 104, 106, and 108 of the electronic component 26 into the space 122 under the electronic component 26, thereby covering the solder connections 46.

Figure 9:
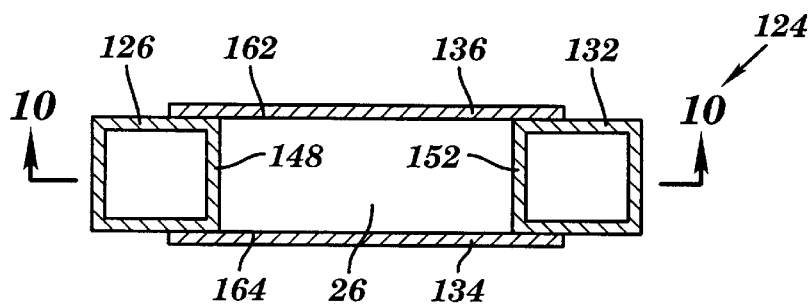
FIG. 9 illustrates a plan cross-sectional view of a second embodiment of an underfill nozzle apparatus in accordance with the present invention.
Figure 10:
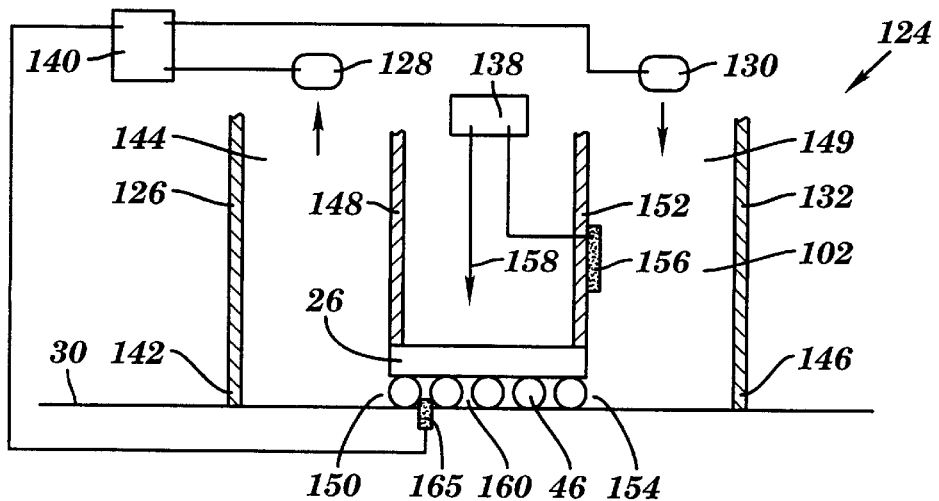
FIG. 10 illustrates a cross-sectional view taken along line 9—9 of the underfill nozzle apparatus of FIG. 9.

FIGS. 9 and 10 illustrates a second embodiment of an underfill nozzle apparatus 124 in accordance with the present invention. Solder connections 46 attach, and create a space 160 between, the electronic component 26 and the surface of the substrate 30. The underfill nozzle apparatus 124 includes a vacuum tube 126, a vacuum source 128, an underfill material source 130, an underfill tube 132, baffles 134, 136, a heat generating apparatus 138, and a control system 140.

A first end 142 of the vacuum tube 126 contacts the surface of the substrate 30, and provides an essentially gas tight seal. A second end 144 of the vacuum tube 126 is connected to the vacuum source 128. A first end 146 of the underfill tube 132 contacts the substrate surface 30, and forms a seal against the surface of the substrate 30. A second end 149 of the underfill tube is connected to the underfill material source 130. A side wall 148 of the vacuum tube 126 extends partially toward the substrate 30, thereby providing an opening 150 that allows access to the area under the electronic component 26. Similarly, a side wall 152 of the underfill tube 132 extends partially toward the substrate 30, and provides an opening 154 that allows access to the area under the electronic component 26.

The heat generating apparatus 138 supplies heat to the underfill material 102 using heating coils 156 or other suitable means. The heat supplied by the heating coils 156 reduces the viscosity of the underfill material 102, thereby increasing the flow rate of the underfill material 102 as the underfill material is drawn into the space 160 under the electronic component 26. Heat 158 may also be supplied to the electronic component 26 by the heat generating apparatus 138 to prevent the electronic component 26 from acting as a heat sink and causing a reduction in the temperature of the underfill material 102. Any reduction in the temperature of the underfill material 102 would result in an increase in viscosity and a decrease in the flow rate. The heat 158 may be in the form of radiant heat, a stream of hot gas, a hot liquid, or the like.

Baffles 134, 136 join the vacuum tube 126 to the underfill tube 132. The baffles 134, 136 also form a seal against the surface of the substrate 30 on opposing sides 164, 162 of the electronic component 26.

A control system 140 may be provided to control the operation of the underfill material source 130 and the vacuum source 128. The control system 140 may include a timer and a transducer 165. The transducer 165 is utilized to sense when the region 160 under the electronic component 26 has been filled to a predetermined level with the underfill material 102. The transducer 165 may comprise, for example, a proximity sensor, a light beam switch, or the like.

The control system 140 is configured to activate the vacuum source 128, the underfill material source 130, and the heat generating apparatus 138 to draw a supply of underfill material 102 beneath the electronic component 26. The underfill material 102 rapidly flows from the underfill tube 132, under the electronic component 26, toward the vacuum tube 126, due to the vacuum generated by the vacuum source 128, and the heat supplied by the heat generating apparatus 138. The control system 140 deactivates the vacuum source 128, the underfill material source 130, and the heat generating apparatus 138, upon receipt, of a signal from the transducer 165 indicating that the space 160 under the electronic component 26 has been filled to a predetermined level with underfill material 102. Alternately, a timer may be used by the control system 140 to activate/deactivate the various components of the underfill rework apparatus 124.

Figure 11:
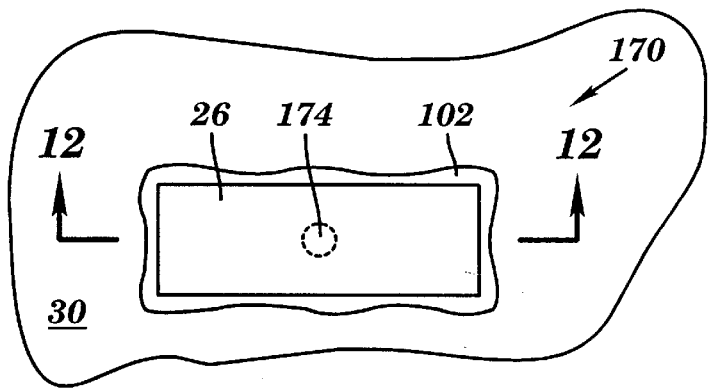
FIG. 11 illustrates a plan view of another embodiment of an underfill nozzle apparatus in accordance with the present invention.
Figure 12:
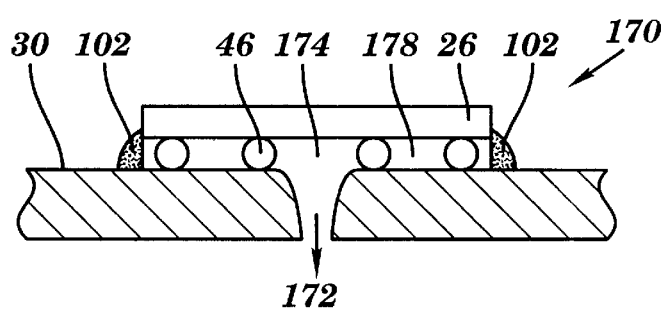
FIG. 12 illustrates a cross-sectional view taken along line 12—12 of the underfill nozzle apparatus of FIG. 11.

FIGS. 11 and 12 illustrate another embodiment of an underfill nozzle apparatus 170 in accordance with the present invention. Underfill material 102 is deposited along the periphery of the electronic component 26. Solder connections 46 create a space 178 between the electronic component 26 and the surface of the substrate 30. A vacuum source 172 supplies a vacuum via a through hole 174 in the substrate 30. As a vacuum is produced by the vacuum source 172, the underfill material 102 is rapidly drawn toward the through hole 174 from the periphery of the electronic component 26, thereby rapidly filling the space 178 under the electronic component 26.

Figure 13:
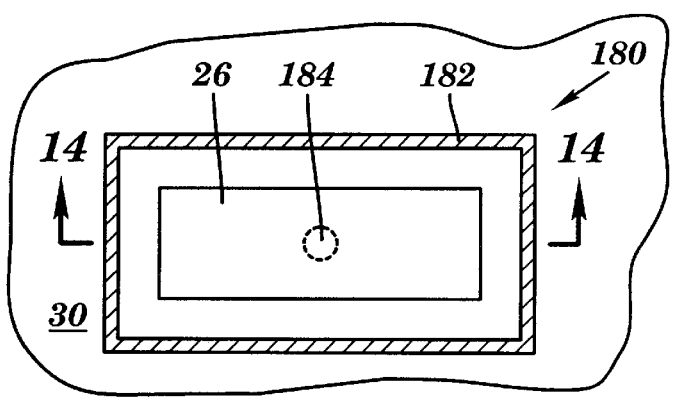
FIG. 13 illustrates a plan cross-sectional view of another embodiment of an underfill nozzle apparatus in accordance with the present invention.
Figure 14:
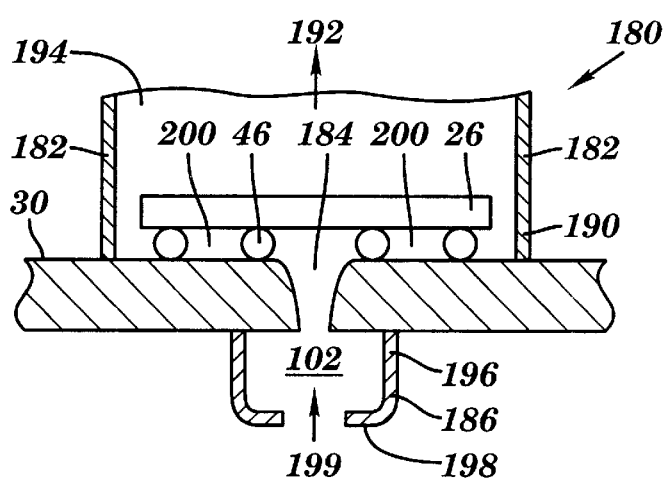
FIG. 14 illustrates a cross-sectional view taken along line 14—14 of the underfill nozzle apparatus of FIG. 13.

FIGS. 13 and 14 illustrate yet another embodiment of an underfill nozzle apparatus 180 in accordance with the present invention. The underfill nozzle apparatus 180 includes a vacuum tube 182 and an underfill tube 186. A through hole 184 is located under the electronic component 26 and passes through the substrate 30. Solder connections 46 create a space 200 between the electronic component 26 and the surface of the substrate 30.

A first end 190 of the vacuum tube 182 has a cross-sectional area slightly larger than that of the electronic component 26. The first end 190 of the vacuum tube 182 contacts the surface of the substrate 30 and provides an essentially gas tight seal around the electronic component 26. A second end 194 of the vacuum tube 182 is connected to a vacuum source 192.

A first end 196 of the underfill tube 186 surrounds the through hole 184. The second end 198 of the underfill tube 186 is connected to a underfill material source 199. Underfill material 102 is injected via the through hole 184 into the space 200 under the electronic component 26. The vacuum applied in the vacuum tube 182 assists the flow of underfill material 102 into the space 200 under the electronic component 26. Specifically, the underfill material 102 is drawn by the vacuum from the center toward the periphery of the space 200 under the electronic component 26.

The foregoing description of the present invention has been presented for purposes of illustration and description. It is not intended to be exhaustive or to limit the invention to the precise form disclosed, and many modifications and variations are possible in light of the above teaching. Such modifications and variations that may be apparent to a person skilled in the art are intended to be included within the scope of this invention as defined by the accompanying claims.

We claim:

1. A reflow method, comprising the steps of:
   directing a flow of a hot gas under an electronic component to reflow solder connections attaching the electronic component to a substrate; and
   injecting a substance into the hot gas to increase a heat capacity of the hot gas.

2. The method according to claim 1, wherein the substance comprises water vapor.

3. The method according to claim 1, further including the step of:
   generating a vacuum under the electronic component to increase the flow of hot gas passing under the electronic component.

4. The method according to claim 1, further including the step of:
   periodically changing a direction of flow of the hot gas under the electronic component to provide a substantially uniform reflow of the solder connections.

5. A reflow method, comprising the steps of:
   directing a flow of a hot material under an electronic component to reflow solder connections attaching the electronic component to a substrate; and
   periodically changing a direction of flow of the hot material under the electronic component to provide a substantially uniform reflow of the solder connections.

6. The method according to claim 5, further including the step of:
   generating a vacuum under the electronic component to increase the flow of hot material passing under the electronic component.

7. The method according to claim 5, wherein the step of periodically changing a direction of flow further comprises the step of:
   periodically reversing the direction of flow of the hot material under the electronic component.

8. A method for reflowing solder connections between an electronic device and a substrate, comprising:
   directing a flow of a hot gas against the solder connections; and
   injecting water vapor into the hot gas to increase a heat capacity of the hot gas.

9. The method according to claim 8, further including:
   generating a vacuum under the electronic device to increase the flow of hot gas against the solder connections.

10. The method according to claim 8, further including:
    periodically changing a direction of flow of the hot gas against the solder connections to provide a substantially uniform reflow of the solder connections.

* * * * *